(12) United States Patent
Jin et al.

(10) Patent No.: US 10,497,641 B2
(45) Date of Patent: *Dec. 3, 2019

(54) HEAT DISSIPATION ASSEMBLY AND ELECTRONIC DEVICE

(71) Applicant: Huawei Device Co. Ltd., Dongguan (CN)

(72) Inventors: Linfang Jin, Shenzhen (CN); Yongwang Xiao, Shanghai (CN); Guoping Wang, Shenzhen (CN); Jie Zou, Shenzhen (CN); Hualin Li, Shanghai (CN)

(73) Assignee: HUAWEI DEVICE CO., LTD., Dongguan (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/140,522

(22) Filed: Sep. 24, 2018

(65) Prior Publication Data

US 2019/0027423 A1 Jan. 24, 2019

Related U.S. Application Data

(63) Continuation of application No. 15/125,952, filed as application No. PCT/CN2014/073633 on Mar. 18, 2014, now Pat. No. 10,103,087.

(51) Int. Cl.
*H01L 23/552* (2006.01)
*H01L 23/427* (2006.01)
(Continued)

(52) U.S. Cl.
CPC ........ *H01L 23/427* (2013.01); *H01L 23/3675* (2013.01); *H01L 23/3736* (2013.01);
(Continued)

(58) Field of Classification Search
CPC .................................................... H01L 23/427
(Continued)

(56) References Cited

U.S. PATENT DOCUMENTS

| 5,940,272 A | 8/1999 | Emori et al. |
| 6,031,716 A | 2/2000 | Cipolla et al. |

(Continued)

FOREIGN PATENT DOCUMENTS

| CN | 1659942 A | 8/2005 |
| CN | 1753172 A | 3/2006 |

(Continued)

*Primary Examiner* — Ajay Arora
(74) *Attorney, Agent, or Firm* — Kilpatrick Townsend & Stockton LLP

(57) ABSTRACT

The present invention provides a heat dissipation assembly and an electronic device, where the heat dissipation assembly includes: a shielding element, where a via hole is disposed on the shielding element, the shielding element is electrically connected to ground copper of a PCB board, and a heat-generating electronic element is disposed on the PCB board; a heat pipe, located on the via hole, where the heat pipe is electrically connected to the shielding element, and the heat pipe, the PCB board, and the shielding element form an electromagnetic shielding can that is used to accommodate the heat-generating electronic element; and an elastic thermal interface material, disposed between the heat pipe and the heat-generating electronic element and mutually fitted to the heat pipe and the heat-generating electronic element.

17 Claims, 6 Drawing Sheets

(51) Int. Cl.
*H01L 23/367* (2006.01)
*H01L 23/373* (2006.01)

(52) U.S. Cl.
CPC ........ *H01L 23/3737* (2013.01); *H01L 23/552* (2013.01); *H01L 2924/0002* (2013.01)

(58) Field of Classification Search
USPC .......................................................... 257/659
See application file for complete search history.

(56) References Cited

U.S. PATENT DOCUMENTS

| | | |
|---|---|---|
| 6,377,474 B1 | 4/2002 | Archambeault et al. |
| 6,657,864 B1 | 12/2003 | Dyckman et al. |
| 2002/0074647 A1 | 6/2002 | Wolf et al. |
| 2002/0172022 A1 | 11/2002 | Dibene et al. |
| 2003/0193794 A1 | 10/2003 | Reis et al. |
| 2006/0059684 A1 | 3/2006 | Lee et al. |
| 2006/0181858 A1 | 8/2006 | Kamemoto |
| 2007/0029070 A1 | 2/2007 | Yamamoto et al. |
| 2007/0139904 A1 | 6/2007 | English et al. |
| 2007/0210082 A1 | 9/2007 | English et al. |
| 2008/0123296 A1 | 5/2008 | Chen et al. |
| 2009/0040731 A1 | 2/2009 | Jin et al. |
| 2009/0301765 A1 | 12/2009 | Strauss et al. |
| 2011/0176279 A1 | 7/2011 | Zhao et al. |
| 2012/0061135 A1 | 3/2012 | Hill et al. |
| 2013/0105123 A1 | 5/2013 | Chen |
| 2014/0340841 A1 | 11/2014 | Yu et al. |

FOREIGN PATENT DOCUMENTS

| | | |
|---|---|---|
| CN | 1819754 A | 8/2006 |
| CN | 201104378 Y | 8/2008 |
| CN | 201156534 Y | 11/2008 |
| CN | 101395980 A | 3/2009 |
| CN | 201502995 U | 6/2010 |
| CN | 201623944 U | 11/2010 |
| CN | 201726630 U | 1/2011 |
| CN | 201894030 U | 7/2011 |
| CN | 202695526 U | 1/2013 |
| CN | 202857216 U | 4/2013 |
| CN | 103098575 A | 5/2013 |
| CN | 103576807 A | 2/2014 |
| EP | 2031952 A1 | 3/2009 |
| FR | 2951048 A1 | 4/2011 |
| JP | H03108365 A | 5/1991 |
| JP | H0697686 A | 4/1994 |
| JP | H08116195 A | 5/1996 |
| JP | H11143585 A | 5/1999 |
| JP | 2006513556 A | 4/2006 |
| JP | 2007067330 A | 3/2007 |
| JP | 2010258179 A | 11/2010 |
| JP | 2012084599 A | 4/2012 |
| JP | 2013225581 A | 10/2013 |
| TW | M459692 U | 8/2013 |
| WO | 2014018491 A2 | 1/2014 |

HEAT DISSIPATION ASSEMBLY AND ELECTRONIC DEVICE

CROSS-REFERENCE TO RELATED APPLICATIONS

This application is a continuation of U.S. patent application Ser. No. 15/125,952, filed on Sep. 13, 2016, which is a National Stage of International Application No. PCT/CN2014/073633, filed on Mar. 18, 2014. The aforementioned patent applications are hereby incorporated by reference in their entireties.

TECHNICAL FIELD

The present invention relates to the field of heat dissipation technologies, and in particular, to a heat dissipation assembly and an electronic device.

BACKGROUND

With rapid popularization of an LTE (Long Term Evolution, Long Term Evolution) technology, the mobile Internet provides a multimedia application with high definition and high performance, which leads to a rapid increase in mobile data services, and a significant increase in power consumption of a mobile terminal device, thereby presenting an unprecedented challenge for heat dissipation design in limited space.

In the prior art, a heat dissipation assembly used for a heat-generating chip in a mobile terminal mainly includes: a first thermal interface material, a shielding can/shielding box, a second thermal interface material, and a heat pipe, where the first thermal interface material, the shielding can/shielding box, the second thermal interface material, and the heat pipe are successively stacked on the heat-generating chip. A heat transfer path between the heat-generating chip and the heat pipe is: the heat-generating chip→the first thermal interface material→the shielding can/shielding box→the second thermal interface material→the heat pipe. Thermal resistance generated when solid bodies are in mutual contact is quite large, and therefore, in the prior art, two thermally conductive pads, that is, the first thermal interface material and the second thermal interface material, are used to reduce the thermal resistance and increase thermal conductivity rate of the heat dissipation assembly.

However, a thermal conductivity coefficient k of a thermally conductive pad is less than 30 W/m-K, and is within 1-3 W/m-K generally. After two thermally conductive pads are used, a heat transfer path in which heat of the chip is transferred to the heat pipe is long, and there is still a small quantity of heat transferred to the heat pipe. Therefore, a technical problem of poor heat dissipation performance of the heat dissipation assembly still exists in the prior art.

SUMMARY

Embodiments of the present invention provide a heat dissipation assembly and an electronic device, so as to resolve a technical problem in the prior art that heat dissipation performance of a heat dissipation assembly is relatively poor, thereby improving the heat dissipation performance of the heat dissipation assembly.

According to a first aspect, an embodiment of this application provides a heat dissipation assembly, where the heat dissipation assembly includes a shielding element, a heat pipe, and a first elastic thermal interface material. In that embodiment, the via hole is disposed on the shielding element; the shielding element is electrically connected to ground copper of a printed circuit board (PCB); and a heat-generating electronic element is disposed on the PCB. In that embodiment, the heat pipe is located on the via hole and is electrically connected to the shielding element. The heat pipe, the PCB, and the shielding element form an electromagnetic shielding can to accommodate the heat-generating electronic element. In that embodiment, the first elastic thermal interface material is located between the heat pipe and the heat-generating electronic element, and is mutually fitted to the heat pipe and the heat-generating electronic element.

With reference to the first aspect, in a first possible implementation manner, that the heat pipe is electrically connected to the shielding element is specifically that: the heat pipe is electrically connected to the shielding element by using an electrically conductive elastomer or an electrically conductive interface material.

With reference to the first possible implementation manner of the first aspect, in a second possible implementation manner, the assembly further includes: the electrically conductive interface material, disposed around the via hole, and mutually fitted to the shielding element and the heat pipe.

With reference to the first possible implementation manner of the first aspect, in a third possible implementation manner, the shielding element includes the electrically conductive elastomer, where the electrically conductive elastomer is disposed around the via hole, and the elastomer is electrically connected to the heat pipe.

With reference to the first aspect, in a fourth possible implementation manner, the first elastic thermal interface material is specifically: an elastic electrically conductive thermal interface material or an elastic insulated thermal interface material, where the first elastic thermal interface material is mutually fitted to the heat pipe by using the via hole.

With reference to the first aspect and any one of the first to fourth possible implementation manners of the first aspect, in a fifth possible implementation manner, the assembly further includes a second elastic thermal interface material, and a thermally conductive metal block. The second elastic thermal interface material is mutually fitted to the heat pipe; and the thermally conductive metal block is disposed between the second elastic thermal interface material and the PCB, and is mutually fitted to the second elastic thermal interface material, where the thermally conductive metal block is connected to the heat-generating electronic element by using a thermally conductive layer on the PCB.

With reference to the fifth possible implementation manner of the first aspect, in a sixth possible implementation manner, the second elastic thermal interface material is specifically: an elastic electrically conductive thermal interface material or an elastic insulated thermal interface material.

According to a second aspect, an embodiment of this application provides a heat dissipation assembly, where the heat dissipation assembly includes a thermally conductive metal block, an elastic thermal interface material, and a heat pipe. The thermally conductive metal block is disposed on a PCB, and is connected, by using a thermally conductive layer of the PCB, to a heat-generating electronic element disposed on the PCB. The elastic thermal interface material is fitted on the thermally conductive metal block; and the heat pipe is fitted on the elastic thermal interface material.

With reference to the second aspect, in a first possible implementation manner, the thermally conductive layer is specifically: a first copper layer on a surface of the PCB, and/or a second copper layer inside the PCB.

With reference to the second aspect or the first possible implementation manner of the second aspect, in a second possible implementation manner, the assembly further includes: a shielding element, where a via hole is disposed on the shielding element, the heat pipe is located on the via hole, the shielding element is electrically connected to the heat pipe, and the heat pipe, the PCB, and the shielding element form an electromagnetic shielding can to accommodate the heat-generating electronic element and the thermally conductive metal block.

With reference to the second possible implementation manner of the second aspect, in a third possible implementation manner, that the shielding element is electrically connected to the heat pipe is specifically that: the heat pipe is electrically connected to the shielding element by using an electrically conductive elastomer or an electrically conductive interface material.

With reference to the third possible implementation manner of the second aspect, in a fourth possible implementation manner, the assembly further includes: the electrically conductive interface material, disposed around the via hole, and mutually fitted to the shielding element and the heat pipe.

With reference to the third possible implementation manner of the second aspect, in a fifth possible implementation manner, the shielding element includes the electrically conductive elastomer, where the electrically conductive elastomer is disposed around the via hole, and the elastomer is electrically connected to the heat pipe.

According to a third aspect, an embodiment of this application provides a heat dissipation assembly, where the heat dissipation assembly includes a shielding element, a heat pipe, a first elastic thermal interface material, and a first elastic thermal interface material. The shielding element covers a heat-generating electronic element of a PCB, and is electrically connected to a ground copper layer of the PCB. The heat pipe is located on the shielding element and is connected to the shielding element by means of welding or bonding. The first elastic thermal interface material is fitted between the heat-generating electronic element and the shielding element.

With reference to the third aspect, in a first possible implementation manner, the assembly further includes a thermally conductive metal block, and a second elastic thermal interface material. The thermally conductive metal block is disposed on the PCB, and is connected to the heat-generating electronic element by using the ground copper layer. The second elastic thermal interface material is located between the thermally conductive metal block and the heat pipe, and is mutually fitted to the thermally conductive metal block and the heat pipe.

According to a fourth aspect, an embodiment of this application provides an electronic device, including an enclosure, a heat dissipation assembly and a via hole. The heat dissipation assembly is located in the enclosure and includes a shielding element, a heat pipe, and a first elastic thermal interface material. A via hole is disposed on the shielding element, the shielding element is electrically connected to ground copper of a PCB, and a heat-generating electronic element is disposed on the PCB. The heat pipe is located on the via hole, the heat pipe is electrically connected to the shielding element, and the heat pipe, the PCB, and the shielding element form an electromagnetic shielding can to accommodate the heat-generating electronic element. The first elastic thermal interface material is located between the heat pipe and the heat-generating electronic element, and is mutually fitted to the heat pipe and the heat-generating electronic element.

With reference to the fourth aspect, in a first possible implementation manner, that the heat pipe is electrically connected to the shielding element is specifically that: the heat pipe is electrically connected to the shielding element by using an electrically conductive elastomer or an electrically conductive interface material.

With reference to the first possible implementation manner of the fourth aspect, in a second possible implementation manner, the heat dissipation assembly further includes: the electrically conductive interface material, disposed around the via hole, and mutually fitted to the shielding element and the heat pipe.

With reference to the first possible implementation manner of the fourth aspect, in a third possible implementation manner, the shielding element includes the electrically conductive elastomer, where the electrically conductive elastomer is disposed around the via hole, and the elastomer is electrically connected to the heat pipe.

With reference to the third possible implementation manner of the fourth aspect, in a fourth possible implementation manner, the first elastic thermal interface material is specifically: an elastic electrically conductive thermal interface material or an elastic insulated thermal interface material, where the first elastic thermal interface material is mutually fitted to the heat pipe by using the via hole.

With reference to the fourth aspect and any one of the first to fourth possible implementation manners of the fourth aspect, in a fifth possible implementation manner, the heat dissipation assembly further includes a second elastic thermal interface material, and a thermally conductive metal block. The second elastic thermal interface material is mutually fitted to the heat pipe. The thermally conductive metal block is disposed between the second elastic thermal interface material and the PCB, and is mutually fitted to the second elastic thermal interface material. The thermally conductive metal block is connected to the heat-generating electronic element by using a thermally conductive layer on the PCB.

With reference to the fifth possible implementation manner of the fourth aspect, in a sixth possible implementation manner, the second elastic thermal interface material is specifically: an elastic electrically conductive thermal interface material or an elastic insulated thermal interface material.

With reference to the fourth aspect, in a possible implementation manner, the electronic device further includes a thermally conductive support that is located in the enclosure, where the thermally conductive support is connected to the heat pipe.

According to a fifth aspect, an embodiment of this application provides an electronic device, including an enclosure, and a heat dissipation assembly. The heat dissipation assembly is located in the enclosure. The heat dissipation assembly includes a thermally conductive metal block, an elastic thermal interface material, and a heat pipe. The thermally conductive metal block is disposed on a PCB and is connected, by using a thermally conductive layer of the PCB, to a heat-generating electronic element disposed on the PCB. The elastic thermal interface material is fitted on the thermally conductive metal block; and the heat pipe is fitted on the elastic thermal interface material.

With reference to the fifth aspect, in a first possible implementation manner, the thermally conductive layer is specifically: a first copper layer on a surface of the PCB, and/or a second copper layer inside the PCB.

With reference to the fifth aspect or the first possible implementation manner of the fifth aspect, in a second possible implementation manner, the heat dissipation assembly further includes: a shielding element, where a via hole is disposed on the shielding element, the heat pipe is located on the via hole, the shielding element is electrically connected to the heat pipe, and the heat pipe, the PCB, and the shielding element form an electromagnetic shielding can to accommodate the heat-generating electronic element and the thermally conductive metal block.

With reference to the second possible implementation manner of the fifth aspect, in a third possible implementation manner, that the shielding element is electrically connected to the heat pipe is specifically that: the heat pipe is electrically connected to the shielding element by using an electrically conductive elastomer or an electrically conductive interface material.

With reference to the third possible implementation manner of the fifth aspect, in a fourth possible implementation manner, the heat dissipation assembly further includes: the electrically conductive interface material, disposed around the via hole, and mutually fitted to the shielding element and the heat pipe.

With reference to the third possible implementation manner of the fifth aspect, in a fifth possible implementation manner, the shielding element includes the electrically conductive elastomer, where the electrically conductive elastomer is disposed around the via hole, and the elastomer is electrically connected to the heat pipe.

With reference to the fifth aspect, in a possible implementation manner, the electronic device further includes a thermally conductive support that is located in the enclosure, where the thermally conductive support is connected to the heat pipe.

According to a sixth aspect, an embodiment of this application provides an electronic device, including an enclosure, and a heat dissipation assembly. The heat dissipation assembly is located in the enclosure, and includes a shielding element, a heat pipe, and a first elastic thermal interface material. The shielding element covers a heat-generating electronic element of a PCB, and the shielding element is electrically connected to a ground copper layer of the PCB. The heat pipe is located on the shielding element, and the heat pipe is connected to the shielding element by means of welding or bonding. The first elastic thermal interface material is fitted between the heat-generating electronic element and the shielding element.

With reference to the sixth aspect, in a first possible implementation manner, the heat dissipation assembly further includes a thermally conductive metal block, disposed on the PCB, where the thermally conductive metal block is connected to the heat-generating electronic element by using the ground copper layer; and a second elastic thermal interface material, located between the thermally conductive metal block and the heat pipe, and mutually fitted to the thermally conductive metal block and the heat pipe.

With reference to the sixth aspect, in a possible implementation manner, the electronic device further includes a thermally conductive support that is located in the enclosure, where the thermally conductive support is connected to the heat pipe.

The foregoing one or more technical solutions in the embodiments of this application have at least the following beneficial effects: a via hole is disposed on a shielding element, and a thermal interface material that is fitted on a heat-generating electronic element is fitted to a heat pipe by using the via hole, so that heat of the heat-generating electronic element may be transferred to the heat pipe by using the thermal interface material, which reduces thermal resistance of a heat dissipation assembly and shortens a heat transfer path between the heat-generating electronic element and the heat pipe, thereby resolving a technical problem in the prior art that heat dissipation performance of a heat dissipation assembly is relatively poor, and improving the heat dissipation performance of the heat dissipation assembly.

DESCRIPTION OF EMBODIMENTS

To resolve a technical problem existing in the prior art that heat dissipation performance of a heat dissipation assembly is relatively poor, embodiments of the present invention provide a heat dissipation assembly and an electronic device.

To make the objectives, technical solutions, and advantages of the embodiments of the present invention clearer, the following clearly and completely describes the technical solutions in the embodiments of the present invention with reference to the accompanying drawings in the embodiments of the present invention. Apparently, the described embodiments are some but not all of the embodiments of the present invention. All other embodiments obtained by persons of ordinary skill in the art based on the embodiments of the present invention without creative efforts shall fall within the protection scope of the present invention.

The following describes in detail exemplary implementation manners of the present invention with reference to the accompanying drawings.

Embodiment 1

Figure 1:
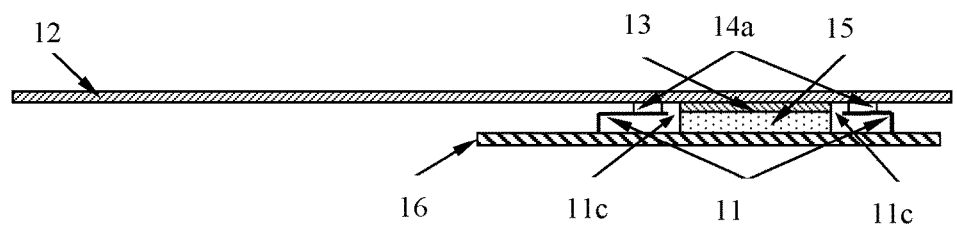
FIG. 1 is a schematic sectional view of a first type of heat dissipation assembly according to Embodiment 1 of this application.

Referring to FIG. 1, the embodiment of this application provides a heat dissipation assembly, where the heat dissipation assembly includes a shielding element 11, a heat pipe 12, and a first elastic thermal interface material 13. As shown, in this embodiment, a via hole 11c is disposed on the shielding element 11, the shielding element 11 is electrically connected to ground copper of a PCB 16, and a heat-generating electronic element 15 is disposed on the PCB 16. As also shown, the heat pipe 12 is located on the via hole 11c and is electrically connected to the shielding element 11, and the heat pipe 12, the PCB 16, and the shielding element 11 form an electromagnetic shielding can to accommodate the heat-generating electronic element 15. As still shown, the first elastic thermal interface material 13 is located between the heat pipe 12 and the heat-generating electronic element 15, and is mutually fitted to the heat pipe 12 and the heat-generating electronic element 15.

Figure 2:
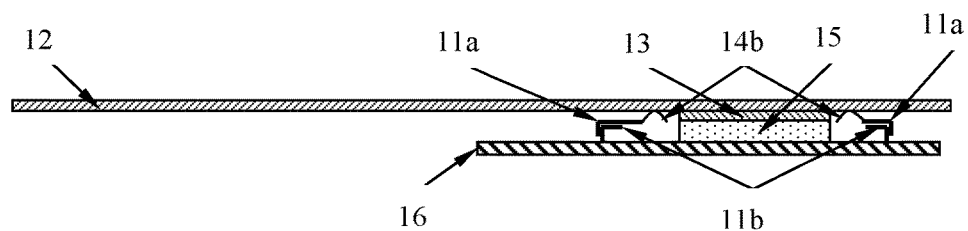
FIG. 2 is a schematic sectional view of a second type of heat dissipation assembly according to Embodiment 1 of this application.

Referring to FIG. 2, the shielding element 11 may include a shielding can 11a and a shielding frame 11b, where the shielding can 11a is welded on the shielding frame 11b, and the shielding frame 11b is electrically connected to ground copper of a PCB 16. It may be understood that the shielding frame 11b and the shielding can 11a may be an integrated forming structure. As shown in FIG. 1, the shielding element 11 can be electrically connected to the ground copper of the PCB 16. The shielding element 11 may cover a heat-generating electronic element 15, which may be a main heat-generating chip on an electronic device, for example: a power amplifier, an application processor (CPU, Central Processing Unit), or a power management chip (PMIC, Power Management IC).

The shielding element 11 may be configured to shield electromagnetic interference between the heat-generating electronic element 15 and other components. Because the via hole 11c is disposed on the shielding element 11, electromagnetic interference outside a cavity of the shielding element 11 interferes with the heat-generating electronic element 15 inside the cavity of the shielding element 11 by using the via hole 11c, and an electromagnetic field generated by the heat-generating electronic element 15 also interferes with an external component by using the via hole 11c. To avoid this case of electromagnetic interference, in the embodiment of this application, a heat pipe 12 covers the via hole 11c of the shielding element 11, and the heat pipe 12 is electrically connected to the shielding element 11. That is, the heat pipe 12 and the shielding element 11 are kept in a mutually electrically conductive state, so that the heat pipe 12, the PCB 16, and the shielding element 11 form an electromagnetic shielding can to accommodate the heat-generating electronic element 15, thereby shielding electromagnetic interference between the heat-generating electronic element 15 and other components.

The shielding element 11 may be connected to the heat pipe 12 by using electrically conductive foam, an electrically conductive elastomer, or an electrically conductive interface material, so that the shielding element 11 is electrically connected to the heat pipe 12.

In some embodiments, as shown in FIG. 2, the shielding element 11 further includes an electrically conductive elastomer 14b, where the electrically conductive elastomer 14b is disposed around the via hole of the shielding element 11. The electrically conductive elastomer 14b is in contact with the heat pipe 12, and forms an electrical connection to the heat pipe 12.

It may be understood that the shielding element 11 may also exclude the electrically conductive elastomer 14b, and the heat dissipation assembly may further include an electrically conductive interface material 14a, as shown in FIG. 1. The electrically conductive interface material 14a can include, but is not limited to, electrically conductive rubber, electrically conductive foam, and the like. The electrically conductive interface material 14a is disposed around the via hole 11c of the shielding element 11, and is mutually fitted to the shielding element 11 and the heat pipe 12, so that the shielding element 11 forms an electrical connection to the heat pipe 12, thereby forming a shielding can to better shield electromagnetic interference between the heat-generating electronic element 15 and other components.

It should be noted that many dents exist on a surface of a solid body, and a mutually fitting area is relatively small when a solid body is in contact with another solid body, and therefore, thermal resistance generated when the solid bodies are in contact is relatively large. To increase a contact area of the solid bodies to reduce the thermal resistance, a first elastic thermal interface material 13 may be put between the solid bodies, so that dents between the solid bodies may be filled to increase the contact area, thereby reducing the thermal resistance. The first elastic thermal interface material 13 can include, but is not limited to, an elastic thermally conductive pad, thermally conductive gel, a phase-change thermal interface material, silicone grease, and the like. Therefore, in this embodiment, the via hole 11c is disposed on the shielding element 11, so that the heat pipe 12 can be directly mutually fitted, by using the via hole 11c, to the first elastic thermal interface material 13 that is fitted on the heat-generating electronic element 15, which not only ensures that the heat pipe 12 is in sufficient contact with the heat-generating electronic element 15, but also shortens a primary heat dissipation path between heat-generating electronic element 15 and the heat pipe 12 to: the heat-generating electronic element 15→the first elastic thermal interface material 13→the heat pipe 12, thereby greatly improving heat dissipation performance of the heat dissipation assembly. When the heat dissipation assembly is installed in an electronic device, one end that is of the heat pipe 12 and not connected to the first elastic thermal interface material 13 may be fixedly connected to a thermally conductive support on the electronic device, so that heat on the heat pipe 12 can be rapidly transferred to the thermally conductive support and spread out.

In a specific implementation process, the first elastic thermal interface material 13 may be specifically an elastic insulated thermal interface material, or may be an elastic electrically conductive thermal interface material, and the first elastic thermal interface material 13 is mutually fitted to the heat pipe 12 by using the via hole 11c.

Figure 3:
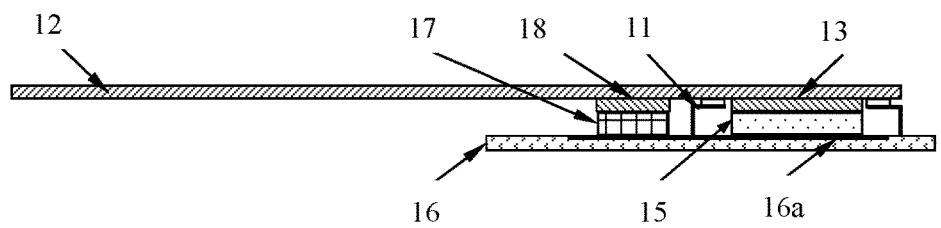
FIG. 3 is a schematic sectional view of a third type heat dissipation assembly according to Embodiment 1 of this application.

Referring to FIG. 3, a heat dissipation assembly provided by the embodiment of this application may further include: a second elastic thermal interface material 18 and a thermally conductive metal block 17, where the second elastic thermal interface material 18 is mutually fitted to the heat pipe 12, the thermally conductive metal block 17 is disposed between the second elastic thermal interface material 18 and a PCB 16, and is mutually fitted to the second elastic thermal interface material 18, and the thermally conductive metal block 17 is connected to a heat-generating electronic element 15 by using a thermally conductive layer 16a on the PCB 16. The heat-generating electronic element 15 is disposed on the PCB 16, heat of the heat-generating electronic element 15 may be further transferred to the thermally conductive layer 16a on the PCB 16, where the thermally conductive layer 16a may be, for example, a copper layer on a surface of the PCB 16 and/or a copper layer inside the PCB 16.

When the thermally conductive layer of the PCB 16 is the copper layer on the surface of the PCB 16, the thermally conductive metal block 17 may be directly electrically connected to the copper layer on the surface of the PCB 16.

When the thermally conductive layer of the PCB 16 is the copper layer inside the PCB 16, the thermally conductive metal block 17 disposed on the PCB 16 may be electrically connected to the copper layer inside the PCB 16 by using a thermal via (for example, a thermal via hole, a thermal buried via, or a thermal blind via).

The thermally conductive metal block 17 is disposed on the PCB 16 adjacent to the heat-generating electronic element 15, where the thermally conductive metal block 17 may be an element with a relatively high thermal conductivity coefficient, for example, a copper block or an aluminum block, so that heat generated by the electronic element 15 may be further transferred to the heat pipe 12 by using the thermally conductive layer 16a, the thermally conductive metal block 17, and the second elastic thermal interface material 18 that is fitted on the thermally conductive metal block 17, thereby further reducing temperature of the heat-generating electronic element 15, which generates a better heat dissipation effect.

Figure 4:
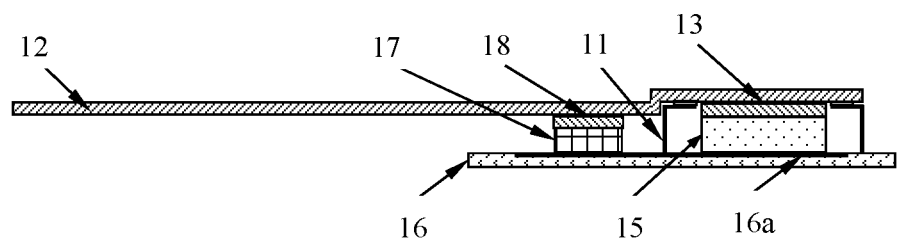
FIG. 4 is a schematic sectional view of a fourth type of heat dissipation assembly according to Embodiment 1 of this application.

In a specific implementation process, for an electronic device that has a relatively high requirement on a thickness, such as an ultra thin handset, to avoid an increase in a thickness of the electronic device, referring to FIG. 4, a heat pipe 12 may be bent into two parts: one part covers a first elastic thermal interface material 13, and the other part covers a second elastic thermal interface material 18. The heat pipe 12 that covers the second elastic thermal interface material 18 may be built into a via hole of a support of the electronic device, so that the thickness of the electronic device may be reduced.

Figure 5:
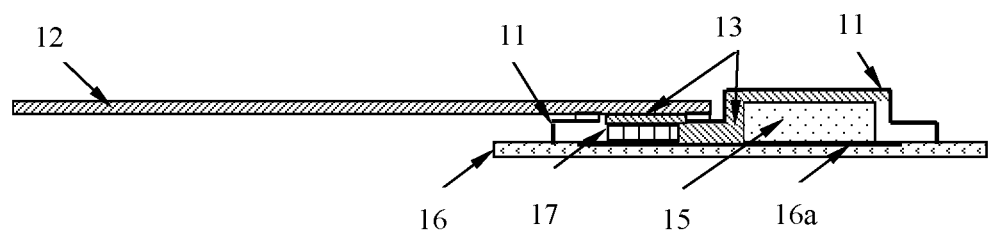
FIG. 5 is a schematic sectional view of a fifth type of heat dissipation assembly according to Embodiment 1 of this application.

According to a design requirement on product stacking and device layout, a thermally conductive metal block 17 may be disposed in a cavity of a shielding element 11, or may be disposed outside the cavity of the shielding element 11. Referring to FIG. 5, when a thermally conductive metal block 17 is disposed in a cavity of a shielding element 11, a first elastic thermal interface material 13 and a second elastic thermal interface material 18 that are of a heat dissipation assembly provided by the embodiment of this application may be an integrated forming structure, as shown in FIG. 5. When the first elastic thermal interface material 13 and the second elastic thermal interface material 18 are an integrated forming structure, the elastic thermal interface material may be specifically a 3D thermally conductive pad, thermally conductive gel, and the like. When the thermally conductive metal block 17 is disposed outside the cavity of the shielding element 11, the first elastic thermal interface material 13 and the second elastic thermal interface material 18 that are of the heat dissipation assembly provided by the embodiment of this application are two independent elements, as shown in FIG. 3 and FIG. 4.

Embodiment 2

Figure 6:
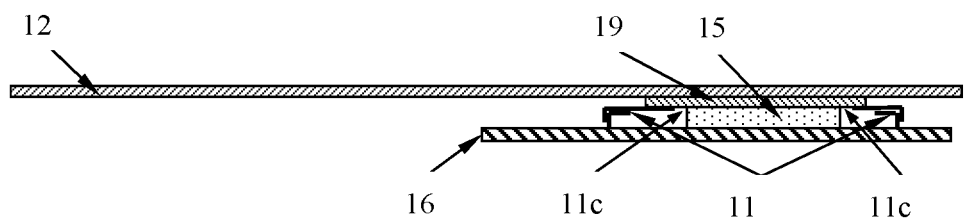
FIG. 6 is a schematic sectional view of a first type of heat dissipation assembly according to Embodiment 2 of this application.

Referring to FIG. 6, the embodiment shown in FIG. 6 provides a heat dissipation assembly, where the heat dissipation assembly includes the shielding element 11, an elastic electrically conductive thermal interface material 19, and the heat pipe 12. As shown, in this embodiment, a via hole 11c is disposed on the shielding element 11, the shielding element 11 is electrically connected to ground copper of a PCB 16, and a heat-generating electronic element 15 is disposed on the PCB 16. As also shown, the elastic electrically conductive thermal interface material 19 is located on the via hole 11c, and is fitted to the shielding element 11. In this embodiment, the elastic electrically conductive thermal interface material 19, the PCB 16, and the shielding element 11 form an electromagnetic shielding can to accommodate the heat-generating electronic element 15. As still shown, the heat pipe 12 is located on the elastic electrically conductive thermal interface material 19, and is mutually fitted to the elastic electrically conductive thermal interface material 19.

As shown in FIG. 6, the elastic electrically conductive thermal interface material 19 may be fitted on the heat-generating electronic element 15. In this case, heat of the heat-generating electronic element 15 is transferred to the heat pipe 12 by using the elastic electrically conductive thermal interface material 19, which shortens a heat transfer path between the heat-generating electronic element 15 and the heat pipe 12, thereby improving heat dissipation performance of the heat dissipation assembly. When the heat dissipation assembly is installed in an electronic device, one end that is of the heat pipe 12 and not connected to the elastic electrically conductive thermal interface material 19 may be fixedly connected to a thermally conductive support on the electronic device, so that heat on the heat pipe 12 can be rapidly transferred to the thermally conductive support and spread out.

Figure 7:
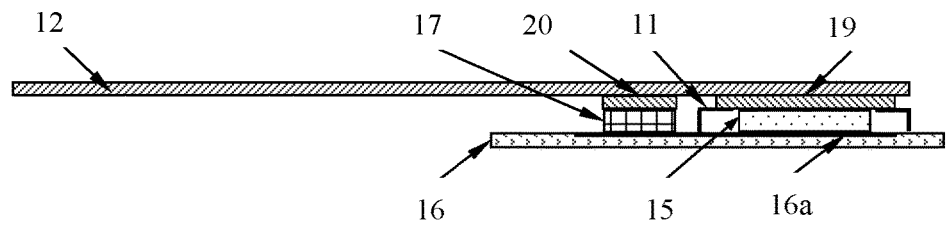
FIG. 7 is a schematic sectional view of a second type of heat dissipation assembly according to Embodiment 2 of this application.

Referring to FIG. 7, a heat dissipation assembly provided by some embodiments may further include: an elastic thermal interface material 20 and a thermally conductive metal block 17, where the elastic thermal interface material 20 is mutually fitted to the heat pipe 12, the thermally conductive metal block 17 is disposed between the elastic thermal interface material 20 and a PCB 16, and is mutually fitted to the elastic thermal interface material 20, and the thermally conductive metal block 17 is connected to a heat-generating electronic element 15 by using a thermally conductive layer 16a on the PCB 16. The heat-generating electronic element 15 is disposed on the PCB 16, heat of the heat-generating electronic element 15 may be further transferred to the thermally conductive layer 16a on the PCB 16, where the thermally conductive layer 16a may be, for example, a copper layer on a surface of the PCB and/or a copper layer inside the PCB.

When the thermally conductive layer 16a of the PCB 16 is the copper layer on the surface of the PCB 16, the thermally conductive metal block 17 may be directly electrically connected to the copper layer on the surface of the PCB 16.

When the thermally conductive layer 16a of the PCB 16 is the copper layer inside the PCB 16, the thermally conductive metal block 17 disposed on the PCB 16 may be electrically connected to the copper layer inside the PCB 16 by using a thermal via (for example, a thermal via hole, a thermal buried via, or a thermal blind via).

The thermally conductive metal block 17 is disposed on the PCB 16 adjacent to the heat-generating electronic element 15, where the thermally conductive metal block 17 may be an element with a relatively high thermal conductivity coefficient, for example, a copper block or an aluminum block, so that heat generated by the electronic element 15 may be further transferred to the heat pipe 12 by using the thermally conductive layer 16a, the thermally conductive metal block 17, and the elastic thermal interface material 20 that is fitted on the thermally conductive metal block 17, thereby further reducing temperature of a heat-generating chip, which generates a better heat dissipation effect.

It may be understood that the thermally conductive metal block 17 and the elastic thermal interface material 20 may be located in the shielding element 11, or may be not in the shielding element 11, which is not limited in the embodiment of the present invention.

Embodiment 3

Figure 8:
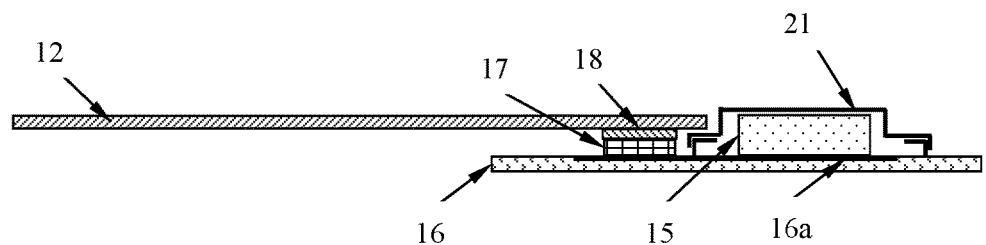
FIG. 8 is a schematic sectional view of a first type of heat dissipation assembly according to Embodiment 3 of this application.

Referring to FIG. 8, the embodiment of this application provides a heat dissipation assembly, where the heat dissipation assembly includes the thermally conductive metal block 17, an elastic thermal interface material 18, and the heat pipe 12. The thermally conductive metal block 17 is disposed on a PCB 16, and is connected, by using a thermally conductive layer 16a of the PCB, to a heat-generating electronic element 15 disposed on the PCB 16. The elastic thermal interface material 18 and is fitted on the thermally conductive metal block 17. The heat pipe 12 is fitted on the elastic thermal interface material 18.

In an actual application process, because many copper layers and thermal vias are disposed on the PCB 16, most of heat of the heat-generating electronic element 15 is transferred to the PCB 16. Therefore, in the embodiment of this application, for a case in which most of heat is transferred to the PCB 16, the thermally conductive metal block 17 is disposed on the PCB 16 adjacent to the heat-generating electronic element 15, where a thermal conductivity coefficient of the thermally conductive metal block 17 is relatively high, the thermally conductive metal block 17 is connected to the heat-generating electronic element 15 by using the thermally conductive layer 16a, and the thermally conductive layer 16a may be specifically a first copper layer on a surface of the PCB 16 and/or a second copper layer inside the PCB 16. When the thermally conductive layer 16a is the first copper layer on the surface of the PCB 16, the thermally conductive metal block 17 may be directly electrically connected to the first copper layer on the surface of the PCB 16; and when the thermally conductive layer 16a is the second copper layer inside the PCB 16, the thermally conductive metal block 17 disposed on the PCB 16 may be electrically connected to the second copper layer inside the PCB by using a thermal via (for example, a thermal via hole, a thermal buried via, or a thermal blind via). Therefore, heat of the heat-generating electronic element 15 is conducted to the heat pipe 12 by using the thermally conductive layer 16a on the PCB 16, the thermally conductive metal block 17, and the elastic thermal interface material 18 that is fitted on the thermally conductive metal block 17, which shortens a heat transfer path between a heat-generating chip and the heat pipe 12, thereby improving heat dissipation performance of the heat dissipation assembly. When the heat dissipation assembly is installed in an electronic device, one end that is of the heat pipe 12 and not connected to the elastic thermal interface material may be fixedly connected to a metal support on the electronic device, so that heat on the heat pipe 12 can be rapidly transferred to the metal support and spread out.

In some embodiments, the heat dissipation assembly further includes a shielding element 21 that covers the heat-generating electronic element 15 and is electrically connected to ground copper of the PCB 16. As shown in FIG. 8, a thermally conductive metal block 17 may be located outside a cavity of the shielding element 21. It would be understood the thermally conductive metal block 17 not only may be located outside the cavity of the shielding element 21, but also may be disposed in the cavity of the shielding element 11.

Figure 9:
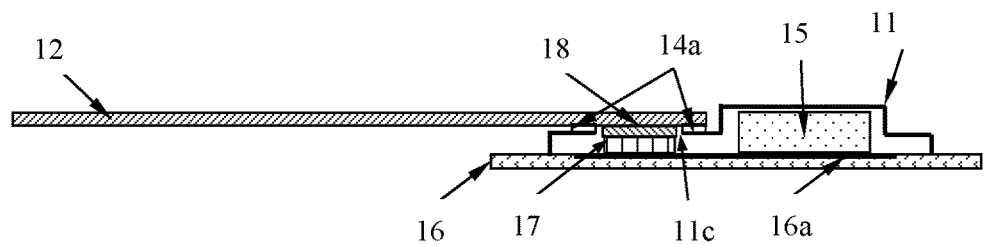
FIG. 9 is a schematic sectional view of a second type of heat dissipation assembly according to Embodiment 3 of this application.
Figure 10:
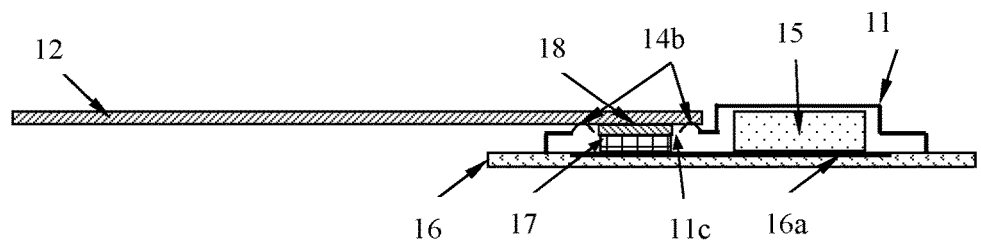
FIG. 10 is a schematic sectional view of a third type of heat dissipation assembly according to Embodiment 3 of this application.

Referring to FIG. 9 or FIG. 10, a heat dissipation assembly further includes: a shielding element 11, where a via hole 11c is disposed on the shielding element 11, a heat pipe 12 is located on the via hole 11c, and the shielding element 11 is electrically connected to the heat pipe 12, and the heat pipe 12, a PCB 16, and the shielding element 11 form an electromagnetic shielding can to accommodate a heat-generating electronic element 15 and a thermally conductive metal block 17.

In some embodiments, the shielding element 11 also includes an electrically conductive elastomer 14b. The electrically conductive elastomer 14b is disposed around the via hole 11c of the shielding element 11. The electrically conductive elastomer 14b is in contact with the heat pipe 12 and forms an electrical connection to the heat pipe 12. In some embodiments, as shown in FIG. 9, the shielding element 11 may also exclude the electrically conductive elastomer 14b, and in this case, the heat dissipation assembly further includes an electrically conductive interface material 14a. The electrically conductive interface material 14a includes but is not limited to electrically conductive rubber, electrically conductive foam, and the like. The electrically conductive interface material 14a is disposed around the via hole 11c of the shielding element 11, and is mutually fitted to the shielding element 11 and the heat pipe 12, so that the shielding element 11 forms an electrical connection to the heat pipe 12, thereby forming a shielding can to shield electromagnetic interference between the heat-generating electronic element 15 and other components.

Embodiment 4

Figure 11:
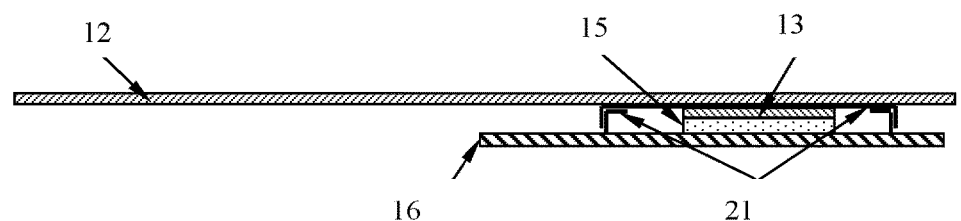
FIG. 11 is a schematic sectional view of a first type of heat dissipation assembly according to Embodiment 4 of this application.

Referring to FIG. 11, the embodiment of this application provides a heat dissipation assembly, where the assembly includes a shielding element 21, the heat pipe 12, and the first elastic thermal interface material 13. The shielding element 21, covering a heat-generating electronic element 15 of a PCB 16, where the shielding element 21 is electrically connected to a ground copper layer of the PCB 16. The heat pipe 12 is located on the shielding element 21, and may be connected to the shielding element 11 by means of welding or bonding. A first elastic thermal interface material 13, fitted between the heat-generating electronic element 15 and the shielding element 21.

It may be understood that many dents exist on a surface of a solid body, and a mutually fitting area is relatively small when a solid body is in contact with another solid body, and therefore, thermal resistance generated when the solid bodies are in contact is relatively large. To increase a contact area of the solid bodies to reduce the thermal resistance, and shorten a heat transfer path of the heat dissipation assembly, in the embodiment of this application, the heat pipe 12 is connected to the shielding element 21 by means of welding or bonding. Because atoms between the heat pipe 12 and the shielding element 21 that are welded together penetrate into and combined with each other, thermal resistance is greatly reduced, and a heat transfer path of the heat-generating electronic element 15 is shortened to: the heat-generating electronic element 15→the first elastic thermal interface material 13→the shielding element 21→the heat pipe 12, thereby improving heat dissipation performance of the heat dissipation assembly. Similarly, dents on a surface between the heat pipe 12 and the shielding element 21 that are bonded together are filled by an adhesive, the thermal resistance is greatly reduced, and a heat transfer path of the heat-generating electronic element 15 is shortened, thereby improving heat dissipation performance of the heat dissipation assembly. When the heat dissipation assembly is installed in an electronic device, one end that is of the heat pipe 12 and not connected to the elastic thermal interface material is fixedly connected to a thermally conductive support on the electronic device, so that heat on the heat pipe 12 can be rapidly transferred to the thermally conductive support and spread out.

Figure 12:
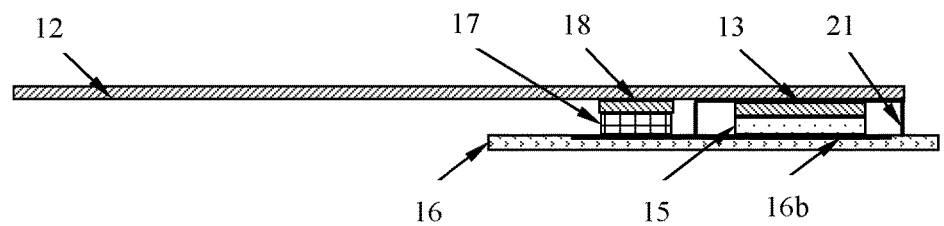
FIG. 12 is a schematic sectional view of a first type of heat dissipation assembly according to Embodiment 4 of this application.

Similarly, referring to FIG. 12, the heat dissipation assembly may further include: a thermally conductive metal block 17 and a second elastic thermal interface material 18. The thermally conductive metal block 17 is disposed on the PCB 16, and the thermally conductive metal block 17 is connected to the heat-generating electronic element 15 by using a ground copper layer 16b on the PCB 16. The second elastic thermal interface material 18 is located between the thermally conductive metal block 17 and the heat pipe 12, and is mutually fitted to the thermally conductive metal block 17 and the heat pipe 12. Therefore, the heat dissipation assembly may further transfer heat of the heat-generating electronic element 15 to the heat pipe 12 by using the ground copper layer 16b, the thermally conductive metal block 17, and the second elastic thermal interface material 18, so that the heat dissipation assembly can transfer out more heat of a heat-generating chip, thereby further improving heat dissipation performance of the heat dissipation assembly.

Embodiment 5

Figure 13:
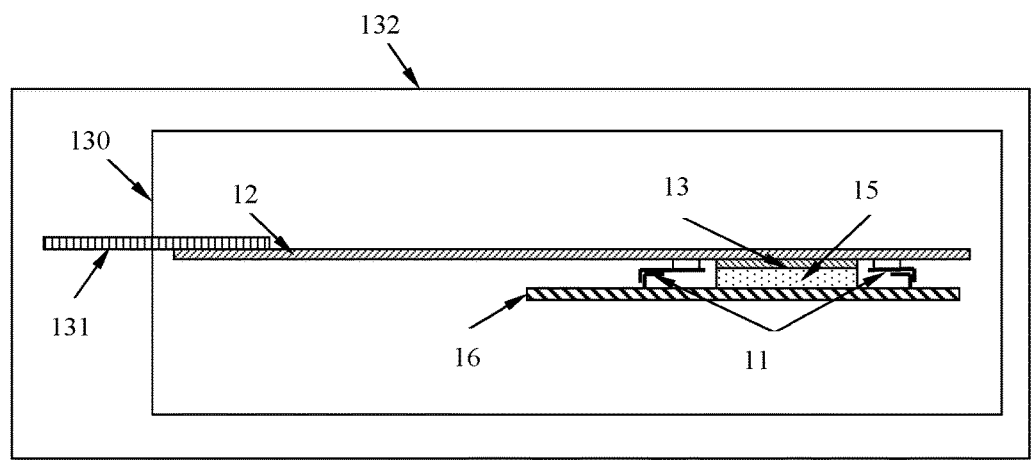
FIG. 13 is a schematic sectional view of an electronic device according to Embodiment 5 of this application.

Referring to FIG. 13 and FIG. 1, the embodiment of this application further provides an electronic device, where the electronic device includes an enclosure 132, and a heat dissipation assembly 130. As shown, the heat dissipation assembly 130 is located in the enclosure 132, and includes the shielding element 11, the heat pipe 12, and the first elastic thermal interface material 13. The via hole 11c is disposed on the shielding element 11, the shielding element 11 is electrically connected to ground copper of a PCB 16, and a heat-generating electronic element 15 is disposed on the PCB 16. The heat pipe 12 is located on the via hole 11c, and the heat pipe 12, the PCB 16, and the shielding element 11 form an electromagnetic shielding can to accommodate the heat-generating electronic element 15. The first elastic thermal interface material 13 is disposed between the heat pipe 12 and the heat-generating electronic element 15, and is mutually fitted to the heat pipe 12 and the heat-generating electronic element 15.

In some embodiments, the electronic device may further include a thermally conductive support 131 that is located in the enclosure 132, where the thermally conductive support 131 may be connected to the heat pipe 12.

It should be noted that the thermally conductive support 131 may be a metal support, for example, a metal support made of a metal material, such as aluminum, copper, and magnesium alloy; and certainly, the thermally conductive support 131 may also be a graphite support having a surface attached with a thermally conductive film prepared from a graphite material.

In some embodiments, that the heat pipe 12 is electrically connected to the shielding element 11 is specifically that: the heat pipe 12 is connected to the shielding element 11 by using an electrically conductive elastomer or an electrically conductive interface material.

In some embodiments, the heat dissipation assembly 130 provided by the embodiment of this application further includes the electrically conductive interface material that is disposed around the via hole 11c and is mutually fitted to the shielding element 11 and the heat pipe 12.

In some embodiments, the shielding element 11 includes the electrically conductive elastomer, where the electrically conductive elastomer is disposed around the via hole 11c, and the elastomer is electrically connected to the heat pipe 12.

In some embodiments, the first elastic thermal interface material 13 is specifically: an elastic electrically conductive thermal interface material or an elastic insulated thermal interface material, and the first elastic thermal interface material 13 is mutually fitted to the heat pipe 12 by using the via hole 11c.

In some embodiments, the heat dissipation assembly 130 further includes: a second elastic thermal interface material 18 that is mutually fitted to the heat pipe 12; and a thermally conductive metal block 17 that is disposed between the second elastic thermal interface material 18 and the PCB 16, and is mutually fitted to the second elastic thermal interface material 18, where the thermally conductive metal block 17 is connected to the heat-generating electronic element 15 by using a thermally conductive layer on the PCB 16.

In some embodiments, the second elastic thermal interface material 18 is specifically: an elastic electrically conductive thermal interface material or an elastic insulated thermal interface material.

All variable manners and specific examples that are of a heat dissipation assembly in the foregoing embodiment corresponding to FIG. 1 to FIG. 5 are also applicable to the electronic device in the embodiment. According to the forgoing detailed descriptions of the heat dissipation assembly, persons skilled in the art may clearly understand an implementation method of the electronic device in the embodiment. Therefore, for brevity of this specification, details are not described herein again.

Embodiment 6

Figure 14:
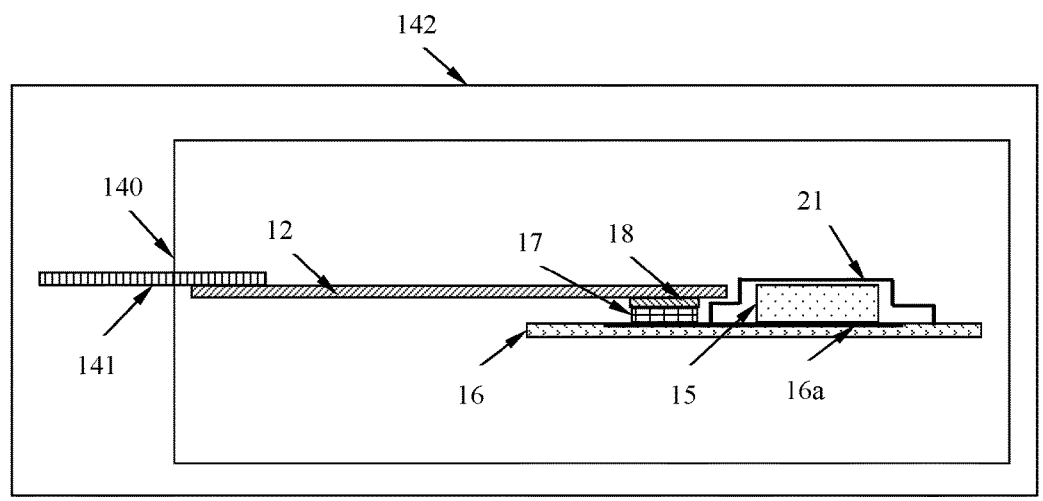
FIG. 14 is a schematic sectional view of an electronic device according to Embodiment 6 of this application.

Referring to FIG. 14, some embodiments provide an electronic device, where the electronic device includes an enclosure 142, and a heat dissipation assembly 140. The heat dissipation assembly 140 is located in the enclosure 142 and includes the thermally conductive metal block 17, the elastic thermal interface material 13, and the heat pipe 12. The thermally conductive metal block 17 is disposed on a PCB 16, and is connected, by using a thermally conductive layer 16a on the PCB, to a heat-generating electronic element 15 disposed on the PCB 16. The elastic thermal interface material 18 is fitted on the thermally conductive metal block 17; and the heat pipe 12 is fitted on the elastic thermal interface material 18.

In some embodiments, the electronic device further includes a thermally conductive support 141 that is located in the enclosure 142, where the heat pipe is connected to the thermally conductive support 141.

It should be noted that the thermally conductive support 141 may be a metal support, for example, a metal support made of a metal material, such as aluminum, copper, and magnesium alloy; and certainly, the thermally conductive support 141 may also be a graphite support having a surface attached with a thermally conductive film prepared from a graphite material.

In some embodiments, the thermally conductive layer 16a is specifically: a first copper layer on a surface of the PCB and/or a second copper layer inside the PCB.

In some embodiments, the heat dissipation assembly 140 provided by the embodiment of this application further includes: a shielding element, where a via hole is disposed on the shielding element, the heat pipe 12 is located on the via hole, the shielding element is electrically connected to the heat pipe 12, and the heat pipe 12, the PCB 16, and the shielding element form an electromagnetic shielding can to accommodate the heat-generating electronic element 15 and the thermally conductive metal block.

In some embodiments, that the shielding element is electrically connected to the heat pipe 12 is specifically that: the heat pipe 12 is connected to the shielding element by using an electrically conductive elastomer or an electrically conductive interface material.

In some embodiments, the heat dissipation assembly 140 further includes the electrically conductive interface material that is disposed around the via hole and is mutually fitted to the shielding element and the heat pipe 12.

In some embodiments, the shielding element includes the electrically conductive elastomer, where the electrically conductive elastomer is disposed around the via hole, and the elastomer is electrically connected to the heat pipe.

All variable manners and specific examples that are of a heat dissipation assembly in the foregoing embodiment corresponding to FIG. 8 to FIG. 10 are also applicable to the electronic device in the embodiment. According to the forgoing detailed descriptions of the heat dissipation assembly, persons skilled in the art may clearly understand an implementation method of the electronic device in the embodiment. Therefore, for brevity of this specification, details are not described herein again.

Embodiment 7

Figure 15:
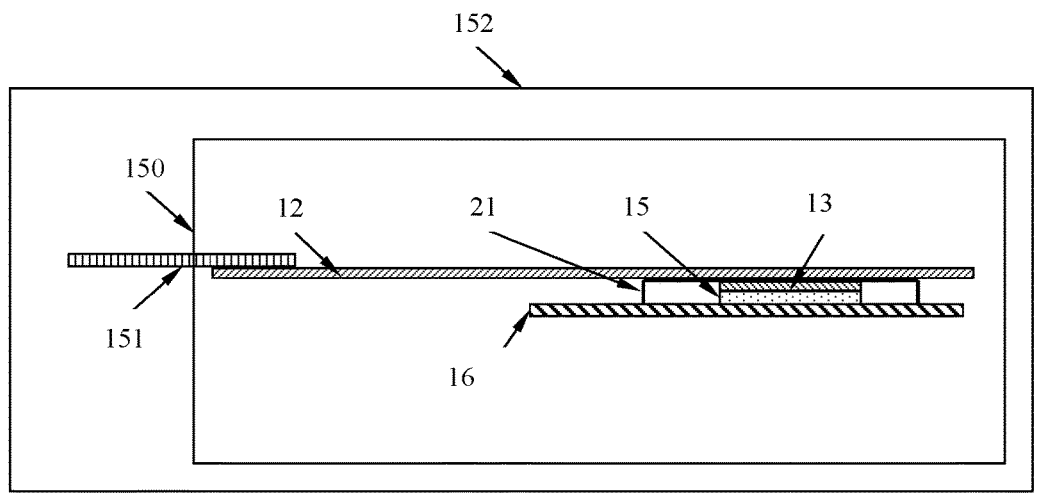
FIG. 15 is a schematic sectional view of an electronic device according to Embodiment 7 of this application.

Referring to FIG. 15, the embodiment of this application further provides an electronic device, where the electronic device includes an enclosure 152, and a heat dissipation assembly 150. The heat dissipation assembly 150 is located in the enclosure 152, and includes a shielding element 21, the heat pipe 12, and the first elastic thermal interface material 13. 他 he shielding element 11 covers a heat-generating electronic element 15 of a PCB 16, and the shielding element 21 is electrically connected to a ground copper layer of the PCB 16. The heat pipe 12 is located on the shielding element 21, and the heat pipe 12 is connected to the shielding element 21 by means of welding or bonding; and the first elastic thermal interface material 13 is fitted between the heat-generating electronic element 15 and the shielding element 21.

in some embodiments, the electronic device further includes a thermally conductive support 151 that is located in the enclosure 152, where the heat pipe 12 is connected to the thermally conductive support 151.

It should be noted that the thermally conductive support 151 may be a metal support, for example, a metal support made of a metal material, such as aluminum, copper, and magnesium alloy; and certainly, the thermally conductive support 151 may also be a graphite support having a surface attached with a thermally conductive film prepared from a graphite material.

In some embodiments, the heat dissipation assembly 150 provided by the embodiment of this application further includes a thermally conductive metal block that is disposed on the PCB 16, where the thermally conductive metal block is connected to the heat-generating electronic element 15 by using the ground copper layer on the PCB 16; and a second elastic thermal interface material that is located between the thermally conductive metal block and the heat pipe 12, and is mutually fitted to the thermally conductive metal block and the heat pipe 12.

All variable manners and specific examples that are of a heat dissipation assembly in the foregoing embodiment corresponding to FIG. 11 to FIG. 12 are also applicable to the electronic device of the embodiment. According to the forgoing detailed descriptions of the heat dissipation assembly, persons skilled in the art may clearly understand an implementation method of the electronic device in the embodiment. Therefore, for brevity of this specification, details are not described herein again.

One or more embodiments of the present invention may achieve at least the following technical effects: a via hole is disposed on a shielding element, and a thermal interface material that is fitted on a heat-generating electronic element is directly fitted to a heat pipe by using the via hole, so that heat of the heat-generating electronic element may be transferred to the heat pipe only by using one layer of thermal interface material, which reduces thermal resistance of a heat dissipation assembly and shortens a heat transfer path between the heat-generating electronic element and the heat pipe, thereby solving a technical problem in the prior art that heat dissipation performance of a heat dissipation assembly is relatively poor, and greatly improving the heat dissipation performance of the heat dissipation assembly.

It may be understood that the electronic device in the foregoing embodiments may be a mobile phone, a router, a wearable device, a modem, a television, a set-top box, or the like.

Although some preferred embodiments of the present invention have been described, persons skilled in the art can make changes and modifications to these embodiments once they learn the basic inventive concept. Therefore, the following claims are intended to be construed as to cover the preferred embodiments and all changes and modifications falling within the scope of the present invention.

Obviously, persons skilled in the art can make various modifications and variations to the embodiments of the present invention without departing from the spirit and scope of the embodiments of the present invention. The present invention is intended to cover these modifications and variations provided that they fall within the scope of protection defined by the following claims and their equivalent technologies.

What is claimed is:
1. An electronic device, comprising:
an enclosure; and
a heat dissipation assembly, located in the enclosure, wherein the heat dissipation assembly comprises a shielding element having a via hole, a heat pipe, and a first elastic thermal interface material; and
a thermally conductive support connected to the heat pipe in a lateral direction;
wherein the shielding element is electrically connected to a ground copper of a printed circuit board (PCB), wherein a heat-generating electronic element is disposed on the PCB,
wherein the heat-generating electronic element is located in a cavity of the shielding element,
wherein the first elastic thermal interface material is fitted onto the heat-generating electronic element through the via hole, and
wherein the heat pipe is located on the first elastic thermal interface material.

2. The electronic device according to claim 1, wherein the heat pipe is electrically connected to the shielding element by using an electrically conductive elastomer or an electrically conductive interface material.

3. The electronic device according to claim 1, wherein the heat dissipation assembly further comprises:
a second elastic thermal interface material; and
a thermally conductive metal block, disposed between the second elastic thermal interface material and the PCB, wherein the thermally conductive metal block is connected to the heat-generating electronic element by using a thermally conductive layer of the PCB.

4. The electronic device according to claim 3, wherein the second elastic thermal interface material is an elastic electrically conductive thermal interface material or an elastic insulated thermal interface material.

5. The electronic device according to claim 1, wherein the first elastic thermal interface material is an elastic insulated thermal interface material or is an elastic electrically conductive thermal interface material.

6. The electronic device according to claim 1, wherein further comprises an electrically conductive interface material, disposed around the via hole, and located between the shielding element and the heat pipe.

7. The electronic device according to claim 1, wherein further comprises an electrically conductive elastomer, the electrically conductive elastomer is disposed around the via hole, and the electrically conductive elastomer is electrically connected to the heat pipe.

8. The electronic device according to claim 1, wherein heat generated by the heat-generating electronic element is transferred to the first elastic thermal interface material and the heat pipe; and heat on the heat pipe is transferred to the thermally conductive support and spread out.

9. The electronic device according to claim 1, wherein the electronic device is a mobile phone.

10. An electronic device, comprising:
an enclosure; and
a heat dissipation assembly, located in the enclosure, wherein the heat dissipation assembly comprises a shielding element, a heat pipe, and a first elastic thermal interface material, wherein the shielding element covers a heat-generating electronic element of a print circuit board (PCB), and the shielding element is electrically connected to a ground copper layer of the PCB, the first elastic thermal interface material is located on the shielding element, and the heat pipe is located on the first elastic thermal interface material; and
a thermally conductive support connected to the heat pipe in a lateral direction.

11. The electronic device according to claim 10, wherein the heat dissipation assembly further comprises:
a thermally conductive metal block, disposed on the PCB, wherein the thermally conductive metal block is connected to the heat-generating electronic element by using a ground copper layer; and
a second elastic thermal interface material, located between the thermally conductive metal block and the heat pipe.

12. The electronic device according to claim 10, wherein the electronic device is a mobile phone.

13. The electronic device according to claim 3, wherein the thermally conductive layer of the PCB is a ground copper layer of the PCB.

14. The electronic device according to claim 1, wherein the heat pipe and the shielding element are electrically connected to each other.

15. The electronic device according to claim 1, wherein the thermally conductive support is a metal support.

16. The electronic device according to claim 1, wherein the thermally conductive support is a graphite support.

17. The electronic device according to claim 10, wherein heat generated by the heat-generating electronic element is transferred to the first elastic thermal interface material and the heat pipe, heat on the heat pipe is transferred to the thermally conductive support and spread out.

* * * * *